United States Patent [19]
Inomata et al.

[11] Patent Number: 6,007,961
[45] Date of Patent: Dec. 28, 1999

[54] RADIATION-SENSITIVE RESIN COMPOSITION

[75] Inventors: Katsumi Inomata; Masahiro Akiyama; Shin-ichiro Iwanaga; Akira Tsuji, all of Yokkaichi, Japan

[73] Assignee: JSR Corporation, Tokyo, Japan

[21] Appl. No.: 08/988,068

[22] Filed: Dec. 10, 1997

[30] Foreign Application Priority Data

Dec. 11, 1996 [JP] Japan .................. 8-352011

[51] Int. Cl.⁶ .............. G03F 7/023; G03F 7/30
[52] U.S. Cl. .......... 430/191; 430/165; 430/192; 430/193; 430/326
[58] Field of Search ............. 430/191, 192, 430/193, 165, 326

[56] References Cited

U.S. PATENT DOCUMENTS

| | | | |
|---|---|---|---|
| 5,554,481 | 9/1996 | Kawabe et al. | 430/192 |
| 5,738,968 | 4/1998 | Hosoda et al. | 430/192 |
| 5,747,218 | 5/1998 | Motota et al. | 430/193 |
| 5,750,310 | 5/1998 | Sato et al. | 430/193 |
| 5,798,201 | 8/1998 | Inomata et al. | 430/193 |

FOREIGN PATENT DOCUMENTS

| | | |
|---|---|---|
| 0 496 640 | 7/1992 | European Pat. Off. . |
| WO 96/20430 | 7/1996 | WIPO . |

*Primary Examiner*—John S. Chu
*Attorney, Agent, or Firm*—Oblon, Spivak, McClelland, Maier & Neustadt, P.C.

[57] ABSTRACT

A radiation-sensitive resin composition including an alkali soluble resin and a quinonediazide compound is provided. The quinonediazide compound has the formula (1), for example:

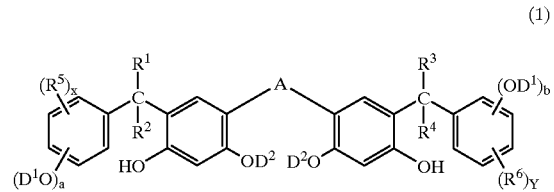

(1)

wherein, $R^1$ to $R^6$ are an alkyl, cycloalkyl or aryl group; a and b are an integer of 1 to 3; $D^1$ and $D^2$ are independently a hydrogen atom or a 1,2-quinonediazidosulfonyl group, provided that at least one of $D^1$ is a 1,2-quinonediazidosulfonyl group; A is a bonding such as single bond; and x and y are an integer of 0 to 2. The composition is suitable as a positive resist, which effectively restrains the occurrence of scum, and excellent in developability, pattern shape, sensitivity, resolution and focus latitude.

20 Claims, 1 Drawing Sheet

RADIATION-SENSITIVE RESIN COMPOSITION

BACKGROUND OF THE INVENTION

1. Field of the Invention

This invention relates to a radiation-sensitive resin composition containing an alkali-soluble resin. More particularly, this invention relates to a radiation-sensitive resin composition suitable as a resist for use in the fabrication of integrated circuits, which is sensitive to a variety of radiations including ultraviolet radiation such as g-rays, i-rays, and the like; far-ultraviolet radiation such as KrF excimer laser radiation, and the like; X-radiation such as synchrotron radiation, and the like; and charged-particle radiation such as electron radiation, and the like; in particular, ultraviolet radiation and far-ultraviolet radiation.

2. Description of the Prior Art

Positive resists are widely used in the fabrication of integrated circuits, and as integrated circuits have become more highly integrated in recent years, there have been desired positive resists capable of forming a resist pattern more improved in resolution.

Generally in order to modify resist materials for improving the resolution of positive resists, there is known, for example, a method comprising lowering the molecular weight of an alkali soluble resin used in the resist. However, the method causes the problem that the resist lowers in heat resistance. While, as an improvement in resolution due to modification of processes, there is known a method comprising increasing the numeral aperture (NA) of a stepper. However, this method causes the problem that depth of focus (focal latitude) becomes narrow, so that simultaneously improvement of resist materials is required. One of countermeasures for the improvement of resist materials is, for example, to increase the amount of a quinonediazide compound added for improving focal latitude. However, an increase in the amount of the quinonediazede compound results in deteriorating developability.

SUMMARY OF THE INVENTION

An object of the present invention is to provide a novel radiation-sensitive resin composition suitable as a positive resist, which has good developability, sensitivity, resolution, and depth of focus.

According to the present invention, the above-mentioned objects of the invention are accomplished by a radiation-sensitive composition comprising:

(A) an alkali soluble resin, and (B) a 1,2-quinonediazide compound represented by the following formula (1):

(1)

wherein, $R^1$ to $R^6$ are independently an alkyl group a cycloalkyl group or an aryl group; a and b are independently an integer of 1 to 3; $D^1$ and $D^2$ are independently a hydrogen atom or a 1,2-quinonediazidosulfonyl group, provided that at least one of $D^1$ is a 1,2-quinonediazidosulfonyl group; A is a single bond, —O—, —S—, —CH$_2$—, —C(CH$_3$)$_2$—, a group represented by the following formula (2):

(2)

or a group represented by the following formula (3):

(3)

and x and y are an integer of 0 to 2.

The composition of the present invention effectively restrains the occurrence of scum, has a superior developability, can form a good pattern shape, has a high sensitivity and a high resolution, and especially improves focal latitude. Thus, the present radiation-sensitive resin composition can be used suitably as a resist for use in the fabrication of integrated circuits having a high degree of integration.

BRIEF DESCRIPTION OF THE DRAWING

FIG. 1 shows a cross-sectional view of resist patterns.

DETAILED DESCRIPTION OF THE PREFERRED EMBODIMENTS

The present invention will now be specifically described.

(A) Alkali-soluble Resin

An alkali-soluble resin (hereinafter referred to as "resin (A)") of the component (A) used in the composition of the present invention may include, e.g., alkali-soluble phenol resins, polyvinylphenol or derivatives thereof, a styrene-maleic anhydride copolymer or derivatives thereof, polyvinyl hydroxybenzoate, acrylic acid resins containing a carboxyl group, and the like. Of these, alkali-soluble phenol resins are preferred.

The resin (A) has a weight-average molecular weight (hereinafter referred to as "Mw") in terms of polystyrene, of normally from 300 to 20,000. In view of the operability required when the composition of the present invention is coated on a substrate, the developability required when used as a resist and the improvement in sensitivity and heat resistance, it has an Mw of preferably from 2,000 to 20,000, and particularly preferably from 3,000 to 15,000. In particular, in the case of the alkali-soluble phenol resin, it has an Mw of preferably from 5,000 to 14,000, and more preferably from 8,000 to 12,000.

Said alkali-soluble phenol resin can be obtained by subjecting a phenol compound represented by the following formula (4):

(4)

wherein n is an integer of 1 to 3, and an aldehyde compound such as a monoaldehyde compound, a bisaldehyde compound, or the like to polycondensation.

Preferred examples of the above-mentioned phenol compound are phenol, o-cresol, m-cresol, p-cresol, 2,3-xylenol, 2,5-xylenol, 3,4-xylenol, 3,5-xylenol, 2,3,5-trimethylphenol and 3,4,5-trimethylphenol, and particularly preferably phenol, m-cresol, p-cresol, 2,3-xylenol, 2,5-xylenol, 3,4-xylenol, 3,5-xylenol and 2,3,5-trimethylphenol. These phenol compounds may be used singly or in combination of two or more thereof.

In the case where the phenol compound is used in combination of two or more thereof, particularly preferred is, for example, a combination of m-cresol/p-cresol=30 to 95/5 to 70 (weight ratio), m-cresol/2,3-xylenol/3,4-xylenol= 20 to 95/5 to 80/0 to 75 (weight ratio), or m-cresol/2,3,5-trimethylphenol/2,3-xylenol=20 to 95/5 to 80/0 to 75 (weight ratio).

The monoaldehyde compound with which the phenol compound is subjected to polycondensation may include, e.g., formaldehydes such as formaldehyde, trioxane, paraformaldehyde, and the like; hemiformals such as methylhemiformal, ethylhemiformal, propylhemiformal, butylhemiformal, phenylhemiformal, and the like; benzaldehydes such as benzaldehyde, o-hydroxybenzaldehyde, m-hydroxybenzaldehyde, p-hydroxybenzaldehyde, o-chlorobenzaldehyde, m-chlorobenzaldehyde, p-chlorobenzaldehyde, o-nitrobenzaldehyde, m-nitrobenzaldehyde, p-nitrobenzaldehyde, o-methylbenzaldehyde, m-methylbenzaldehyde, p-methylbenzaldehyde, p-ethylbenzaldehyde, p-n-butylbenzaldehyde, and the like; acetaldehyde; propylaldehyde; phenylacetaldehyde; α-phenylpropylaldehyde; β-phenylpropylaldehyde; and furfural.

Said bisaldehyde compound may include glyoxal, glutaraldehyde, terephthalaldehyde and isophthalaldehyde.

Of these, formaldehyde, butylhemiformal and o-hydroxybenzaldehyde are particularly preferred.

These aldehyde compounds may also be used singly or in combination of two or more thereof.

The aldehyde compound may be used in an amount of normally from 0.7 to 3.0 mols, and preferably from 0.6 to 1.5 mols, per mol of the phenol compound.

Usually, in the polycondensation reaction of the phenol compound with the aldehyde compound, a catalyst such as an acidic catalyst, a basic catalyst or the like is used. Such an acidic catalyst may include, e.g., hydrochloric acid, nitric acid, sulfuric acid, formic acid, oxalic acid, acetic acid and p-toluenesulfonic acid. The acidic catalyst may be used in an amount of normally from $1 \times 10^{-5}$ to $5 \times 10^{-1}$ mol per mol of the phenol compound.

As a reaction medium for the above polycondensation, water is normally used. If a non-uniform system is formed from the beginning of the reaction when the water is used as the reaction medium, a hydrophilic solvent or a lipophilic solvent may be used. The hydrophilic solvent may include, e.g., alcohols such as methanol, ethanol, propanol, butanol, propylene glycol monomethyl ether, and the like; and cyclic ethers such as tetrahydrofuran, dioxane, and the like. Said lipophilic solvent may include ketones such as methyl ethyl ketone, methyl isobutyl ketone, 2-heptanonel, and the like. These reaction medium may be used in an amount of normally from 20 to 1,000 parts by weight per 100 parts by weight of reactant materials consisting of the phenol compound and the aldehyde compound.

The temperature of the polycondensation reaction can be suitably adjusted in accordance with the reactivity of the reactants; normally a temperature in the range of 10 to 200° C. may be used.

As methods for the polycondensation reaction, there may be appropriately employed a method in which the phenol compound, the aldehyde compound, the catalyst and so forth are charged together in a reaction vessel; a method in which the phenol compound, the aldehyde compound and so forth are added with the progress of reaction to the reaction system in which the catalyst is present; and the like.

After the polycondensation reaction is completed, generally unreacted materials, the catalyst, the reaction medium and so forth which are present in the system are removed. More specifically, after raising the temperature to 130° C. to 230° C. and removing volatile components under reduced pressure, the alkali-soluble phenol resin may be recovered.

Especially in order to obtain a high molecular weight alkali-soluble phenol resin having a Mw of 2,000 to 20,000, the resin obtained in the manner described above is dissolved in a good solvent such as ethylene glycol monomethyl ether acetate, methyl 3-methoxypropionate, methyl isobutyl ketone, 2-heptanone, dioxane, methanol, ethyl acetate, or the like, and then a poor solvent such as n-hexane, n-heptane, or the like is mixed. The thus separated resin solution layer may be recovered to obtain the alkali-soluble phenol resin having a high molecular weight.

The resin (A) may be used singly or in combination of two or more thereof.

The resin (A) may preferably have an Mw of from 2,000 to 20,000 as described above. In order to promote the alkali-solubility of the composition to be obtained, it may be desirable to use a low molecular weight alkali-soluble resin having a Mw of less than 2,000 in combination. The low-molecular weight alkali-soluble resin has an Mw in the range of preferably 300 or more but less than 2,000.

Such a low-molecular weight alkali-soluble resin may include, e.g., low-molecular weight alkali-soluble novolak resins, and alkali-soluble polyhydroxystyrene and derivatives thereof. For example, it may include a phenol/formaldehyde condensed novolak resin, an o-cresol/formaldehyde condensed novolak resin, an m-cresol/formaldehyde condensed novolak resin, a p-cresol/formaldehyde condensed novolak resin, an m-cresol/p-cresol/formaldehyde condensed novolak resin, polyhydroxystyrene, and a hydroxystyrene-styrene copolymer.

The low-molecular weight alkali-soluble novolak resins can be obtained by subjecting a phenol compound and an aldehyde to polycondensation. As this phenol compound, besides those exemplified as the phenol compound used in the synthesis of the above-mentioned novolak resins, 1-naphthol, 2-naphthol, or the like may be used. In this case, the aldehyde may be used in an amount of normally from 0.2 to 0.8 mol, and preferably from 0.3 to 0.7 mol, per mol of the phenol compound. As a catalyst for this polycondensation, the acidic catalyst described above may be used.

The low-molecular weight alkali-soluble resin may be mixed in an amount of normally 50 parts by weight or less based on 100 parts by weight of the high-molecular weight alkali-soluble resin having an Mw of from 2,000 to 20,000.

(B) Quinonediazide Compound

The 1,2-quinonediazide compound (hereinafter referred to as "quinonediazide compound (B)") represented by said formula (1), which is used as the component (B) in the composition of the present invention, acts as a radiation-sensitive agent.

In the formula (1), $R^1$ to $R^6$ are independently an alkyl group, a cycloalkyl group or an aryl group. The alkyl group herein may include preferably an alkyl group having 1 to 4 carbon atoms, specifically such as a methyl group, an ethyl group, an n-propyl group, an isopropyl group, an n-butyl group, a t-butyl group, and the like. The cycloalkyl group may include preferably those having 5 to 7 carbon atoms, e.g., a cyclopentyl group, a cyclohexyl group, and the like. The aryl group may include aryl groups having 6 to 10 carbon atoms, e.g., a phenyl group, a tolyl group, a naphthyl group, and the like.

In the formula (1), $D^1$ and $D^2$ are independently a hydrogen atom or a 1,2-quinonediazidosulfonyl group, provided that when a plurality of $D^1$ are present, at least one of $D^1$ is a 1,2-quinonediazidosulfonyl group.

The 1,2-quinonediazidosulfonyl group herein may include specifically the 1,2-benzoquinonediazido-4-sulfonyl group, the 1,2-naphthoquinonediazido-4-sulfonyl group, the 1,2-naphthoquinonediazido-5-sulfonyl group, and the like.

In the formula (1), A is a single bond, —O—, —S—, —CH$_2$—, —C(CH$_3$)$_2$—, a group represented by said formula (2) or formula (3).

The quinonediazide compound (B) represented by said formula (1) is obtained by reacting a compound having the formula (1) where all of $D^1$ and $D^2$ are a hydrogen atom, that is, a compound having the formula (1) where the groups represented by -OD$^1$ and -OD$^2$ are a hydroxyl group (hereinafter referred to as "precursor (b)") and 1,2-naphthoquinonediazido-5-sulfonyl chloride in the presence of a basic catalyst such as triethylamine or the like.

Specific examples of the precursor (b) may include compounds represented by the following formulas (5-1) to (5-8).

(5-1)

(5-2)

(5-3)

(5-4)

(5-5)

-continued (5-6)

(5-7)

(5-8)

Specific examples of the quinonediazide compound (B) may include the 1,2-benzoquinonediazido-4-sulfonic acid ester, 1,2-naphthoquinonediazido-4-sulfonic acid ester, 1,2-naphthoquinonediazido-5-sulfonic acid ester, 1,2-naphthoquinonediazido-6-sulfonic acid ester, and the like, of the precursor (b) represented by each of the formulas (5-1) to (5-8). Particularly preferred are the 1,2-naphthoquinonediazido-4-sulfonic acid ester and the 1,2-naphthoquinonediazido-5-sulfonic acid ester.

In the composition of the present invention, the quinonediazide compound (B) is used in an amount of normally from 5 to 50 parts by weight, particularly preferably from 10 to 40 parts by weight, per 100 parts by weight of the resin (A). The quinonediazide compound (B) can be used singly or in combination of two or more thereof.

The precursor (b) can be prepared in the following manner.

The precursor compound corresponding to the formula (1) where $D^1$ and $D^2$ are each a hydrogen atom, A is a single bond, —O—, —S—, —CH$_2$— or —C(CH$_3$)$_2$— can be synthesized, for example, using a phenol compound represented by the following formula (6) as a starting material.

(6)

wherein B is a group represented by a single bond, —O—, —S—, —CH$_2$— or —C(CH$_3$)$_2$—.

More specifically, the precursor compound is obtained by heating the phenol compound represented by the formula (6) and isopropenylphenol, in the presence of an acidic catalyst, at about 30 to 60° C.

The reaction may be carried out with a solvent or without a solvent. The solvent may not be used if the reactant components can be uniformly mixed. In the case of using a solvent, single use of toluene or xylene or the use of toluene and n-hexane as a mixture is preferred. As the acidic catalyst, there are used p-toluenesulfonic acid, hydrochloric acid, and the like.

The precursor compound corresponding to the formula (1) where $D^1$ and $D^2$ are each a hydrogen atom, A is represented by said formula (2) or formula (3) can be synthesized, for example, using a dihydroxy compound represented by the formula (7) or formula (8) as a starting material, respectively.

(7)

(8)

Specifically, it can be obtained by heating and reacting the dihydroxy compound represented by the formula (7) or formula (8) and resorcinol at about 35 to 60° C. under the presence of an acidic catalyst to produce an intermediate substance represented by the following formula (7a) or (8a):

(7$_a$)

-continued (8a)

respectively, and then heating the intermediate substance and isopropenylphenol in the presence of the acidic catalyst at about 30 to 60° C. for reaction. Also in this case, the solvent may be used or not. In the case of using a solvent, single use of toluene or xylene or the use of toluene and n-hexane as a mixture is preferred. If the reactant components can be uniformly mixed, any solvent may not be used. As the acidic catalyst, there are used p-toluenesulfonic acid, hydrochloric acid, and the like.

Other Components

To composition of the present invention, can be optionally added other various components and additives, which may be added singly or in combination of two or more.

Other Quinonediazide Compounds

In the composition of the present invention, the quinonediazide compound (B) can be used together with other 1,2-quinonediazide compound, such as other 1,2-benzoquinonediazido-4-sulfonic acid ester, other 1,2-naphthoquinonediazido-4-sulfonic acid ester, other 1,2-naphthoquinonediazido-5-sulfonic acid ester, and the like. Such other 1,2-quinonediazide compound include, for example, 1,2-quinonediazide sulfonic acid esters of the phenol compounds represented by the formulas:

wherein $X_1$ to $X_{15}$ are independently a hydrogen atom, an alkyl group having 1 to 4 carbon atoms, an alkoxy group having 1 to 4 carbon atoms, an aryl group having 6 to 10 carbon atoms, or a hydroxyl group, provided that in each of the groups of $X_1$ to $X_5$, $X_6$ to $X_{10}$, and $X_{11}$ to $X_{15}$, at least one member is a hydroxyl group; and $Y_1$ is a hydrogen atom or an alkyl group having 1 to 4 carbon atoms;

wherein $X_{16}$ to $X_{30}$ mean the same atom or group as in said $X_1$ to $X_{15}$, provided that in each of the groups of $X_{16}$ to $X_{20}$, $X_{21}$ to $X_{25}$, and $X_{26}$ to $X_{30}$, at least one member is a hydroxyl group; and $Y_2$ to $Y_4$ are independently a hydrogen atom or an alkyl group having 1 to 4 carbon atoms;

wherein $X_{31}$ to $X_{44}$ mean the same atom or group as in said $X_1$ to $X_{15}$, provided that in $X_{31}$ to $X_{35}$, at least one member is a hydroxyl group; and $Y_5$ to $Y_8$ are independently a hydrogen atom or an alkyl group having 1 to 4 carbon atoms;

wherein $X_{45}$ to $X_{58}$ are independently a hydrogen atom, a halogen atom, an alkyl group having 1 to 4 carbon atoms, an alkoxy group having 1 to 4 carbon atoms, a cycloalkyl group having 5 to 7 carbon atoms or a hydroxyl group, provided that in each of the groups of $X_{45}$ to $X_{48}$, and $X_{49}$ to $X_{53}$, at least one member is a hydroxyl group; and $Y_9$ and $Y_{10}$ are independently a hydrogen atom, an alkyl group having 1 to 4 carbon atoms or a cycloalkyl group having 5 to 7 carbon atoms; and wherein $X_{59}$ to $X_{80}$ are as defined in said $X_1$ to $X_{15}$, provided that in each of the groups, $X_{59}$ to $X_{63}$, $X_{64}$ to $X_{67}$, $X_{72}$ to $X_{75}$, and $X_{76}$ to $X_{80}$, at least one is a hydroxyl group; and $Y_{11}$ to $Y_{18}$ are independently a hydrogen atom or an alkyl group having 1 to 4 carbon atoms.

The quinonediazide compound other than the quinonediazide compound (B) is mixed in an amount of preferably 50 parts by weight or less, based on 100 parts by weight of the resin (A).

whether a quinonediazide compound other than the quinonediazide compound (B) is used or not, the total weight of the 1,2-quinonediazidosulfonyl residual group contained in the composition of the present invention is preferably adjusted in the range of 5 to 50 weight %, and more preferably 10 to 30 weight %, based on the total solid matter of the composition.

Dissolution Accelerator

In the present invention, for the purpose of improving the alkali-solubility of the composition, it is possible to add a low-molecular weight phenol compound (hereinafter referred to as "dissolution accelerator"). The phenol compound has a molecular weight of less than 2,000, and preferably from 200 to 1,000. This dissolution accelerator may preferably be a phenol compound having 2 to 5 benzene rings, which may include, e.g., compounds represented by the following formulas (9-1) to (9-9). These may be used singly or in combination of two or more thereof. Of these, those represented by the formulas (9-3), (9-5), (9-6) and (9-7) are particularly preferred.

(9-1)

(9-2)

(9-3)

wherein in the formulas (9-1) to (9-3), e and f are independently an integer of 0 to 3, x and y are independently an integer of 0 to 3, provided that e and f are not 0 at the same time, and meet $e+x \leq 5$ and $f+y \leq 5$;

(9-4)

(9-5)

wherein in the formulas (9-4) and (9-5), e, f and g are independently an integer of 0 to 3, x, y and z are independently an integer of 0 to 3, provided that e, f and g are not 0 at the same time, and meet $e+x \leq 5$, $f+y \leq 4$ and $g+z \leq 5$;

(9-6)

(9-7)

-continued (9-8)

wherein in the formulas (9-6) to (9-8), e, f and g are independently an integer of 0 to 3, x, y and z are independently an integer of 0 to 3, provided that e, f and g are not 0 at the same time, and meet $e+x \leq 5$, $f+y \leq 5$ and $g+z \leq 5$;

(9-9)

wherein in the formula (9-9), e, f, g and h are independently an integer of 0 to 3, w, x, y and z are independently an integer of 0 to 3, provided that e, f, g and h are not 0 at the same time, and meet $e+w \leq 5$, $f+x \leq 5$, $g+y \leq 5$ and $h+z \leq 5$.

Compounds such as 2,3,4-trihydroxybenzophenone, 2,3,4,4'-tetrahydroxybenzophenone, curcumin, flavan, etc. may also be used as a dissolution accelerator singly or in combination with a compound of any of said formulas (9-1) to (9-9).

The dissolution accelerator may be mixed in an amount of normally 50 parts by weight or less, and preferably from 5 to 30 parts by weight, based on 100 parts by weight of the resin (A).

Surface Active Agent

A surface active agent is used in order to improve the coating properties and developability of the composition. The surface active agent may include, e.g., polyoxyethylene lauryl ether, polyoxyethylene octyl phenyl ether, polyoxyethylene nonyl phenyl ether, polyoxyethylene glycol dilaurate, polyoxyethylene glycol distearate, MEGAFACS F171, F172, F173 (trade name; produced by Dainippon Ink & Chemicals, Inc.), FLORARD FC430, FC431 (trade name; produced by Sumitomo 3M Ltd.), ASAHI GUARD AG710, SURFRON S-382, SC-101, SC-102, SC-103, SC-104, SC-105, SC-106 (trade name; produced by Asahi Glass Co., Ltd.) KP341 (trade name; produced by Shin-Etsu Chemical Co., Ltd.), POLYFLOW No.75, No.95 (trade name; produced by Kyoeisha Chemical Co., Ltd.), and NBX-7, NBX-14, NBX-15 (trade name; produced by NEOS Co., Ltd.).

These surface active agents are mixed in an amount of preferably 2 parts by weight or less, based on 100 parts by weight of the solid matter of the composition.

The composition of the present invention may also be mixed with dyes and/or pigments for visualizing a latent image formed on the radiation-irradiated portions of resist and preventing an affect due to halation during irradiation, an adhesive auxiliary for improving adhesion, a storage stabilizer, an antifoamer and so forth.

Preparation and use of the Radiation-sensitive Resin Composition

The composition of the present invention can be prepared by mixing the essential components and other components optionally added in prescribed amounts, and dissolving the resultant mixture in a solvent so as to be in a solid matter concentration of, for example, from 20 to 40% by weight, followed by filtration using a filter having a pore size of about 0.2 μm.

Said solvent may include, e.g., ethylene glycol monomethyl ether, ethylene glycol monoethyl ether, ethylene glycol monomethyl ether acetate, ethylene glycol monoethyl ether acetate, diethylene glycol monomethyl ether, diethylene glycol monoethyl ether, propylene glycol monomethyl ether acetate, propylene glycol monopropyl ether acetate, toluene, xylene, methyl ethyl ketone, 2-heptanone, 3-heptanone, 4-heptanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutyrate, methyl 3-methoxypropionate, ethyl 3-ethoxypropionate, ethyl 3-methoxypropionate, ethyl acetate, butyl acetate, methyl pyruvate, and ethyl pyruvate. These solvents may be used singly or in combination of two or more thereof.

To the solvent described above, it is also possible to add a high-boiling solvent such as N-methylformamide, N,N-dimethylformamide, N-methylformanilide, N-methylacetamide, N,N-dimethylacetamide, N-methylpyrrolidone, dimethyl sulfoxide, benzyl ethyl ether, dihexyl ether, acetonylacetone, isophorone, caproic acid, caprylic acid, 1-octanol, 1-nonanol, benzyl alcohol, benzyl acetate, ethyl benzoate, diethyl oxalate, diethyl maleate, 7-butyrolactone, ethylene carbonate, propylene carbonate, ethylene glycol monophenyl ether acetate, and the like. These solvents may also be used singly or in combination of two or more thereof.

Formation of Resist Films and Patterns

The composition of the present invention, prepared in the form of a solution, is coated on a substrate such as a silicon wafer or a wafer coated with aluminum or the like, by a coating method such as spin coating, flow-coating, roll coating or the like.

Subsequently, the coating thus formed is prebaked at 70 to 110° C. to form a resist film, and the resist film is selectively irradiated with radiation (hereinafter referred to as "exposure") at its predetermined positions. The substrate having a desired resist pattern thus formed is developed with a developing solution to form a pattern.

When an operation heating at 70 to 140° C. (hereinafter referred to as "post-exposure baking") is added after the formation of the resist pattern and before the development, it is possible to more enhance the effect of the present invention.

Said radiation may include ultraviolet radiation such as g-rays, i-rays, and the like; far-ultraviolet radiation such as excimer laser radiation, and the like; X-radiation such as synchrotron radiation, and the like; and charged-particle radiation such as electron radiation, and the like; and ultraviolet radiation are preferred.

As the developing solution, an aqueous alkaline solution may be used which is prepared by dissolving an alkaline compound such as sodium hydroxide, potassium hydroxide, sodium carbonate, sodium silicate, sodium metasilicate, ammonia water, ethylamine, n-propylamine, diethylamine, di-n-propylamine, triethylamine, methyldiethylamine, dimethylethanolamine, triethanolamine, tetramethylammonium hydroxide, tetraethylammonium hydroxide, choline, pyrrole, piperidine, 1,8-azabicyclo-[5.4.0]-7-undecene, 1,5-diazabicyclo-[4.3.0]-5-nonane, and the like, in water in a concentration of, e.g., 1 to 10% by weight.

To the developing solution, a water-soluble organic solvent, e.g., alcohols, and the like, such as methanol, ethanol, etc.; and a surface active agent may be added in appropriate quantities. After carrying out development with the developing solution consisting of such an aqueous alkaline solution, it is common to wash the surface with water such as pure water, ultra-pure water, or the like.

EXAMPLES

The present invention will be described below in more detail by Examples to which the present invention are not be restricted at all. Measurement of Mw; identification and quantitative determination of the component (B), quinonediazide compounds; and evaluation of resist, given in Examples were made in accordance with the following way.

<Quinonediazide Compound (B)>

The compositional proportion of each quinonediazide compound was analyzed by high performance liquid chromatography (HPLC) analysis. The structure of a compound corresponding to a peak in each HPLC was identified by $^{13}$C-NMR.

Conditions of HPLC analysis: 3 μl of a test sample which was prepared by dissolving 20 mg of a sample in 10 ml of acetonitrile, was analyzed using an HPLC column (Inertsil ODS 5) produced by Gasukuro Kogyo K. K. and under the conditions of liquid rate being 1.0 ml/minute, eluent being acetonitrile/0.1% aqueous phosphoric acid solution (volume ratio: 80/20). Detection was conducted by measuring the absorption intensity of the test sample at a wavelength of 280 nm. The resultant numerical value was indicated by area %.

<MW>

Measured by gel permeation chromatography (GPC) with monodisperse polystyrene as a standard, using GPC columns (G2000HXL: two columns, G3000HXL: one column, G4000HXL: one column), produced by Toso K. K., under the conditions of flow rate being 1.0 ml/minute, elution solvent being tetrahydrofuran and column temperature being 40° C.

<Sensitivity>

The amount of radiation to which a resist film was exposed at the time when lines and spaces of 0.35 μm line-and-space pattern could be resolved at a ratio of 1:1 in width was indicated as sensitivity (referred to as "effective sensitivity").

<Resolution>

The minimum size of lines and spaces in width of 0.35 μm line-and-space pattern which was formed by an exposure corresponding to the effective sensitivity and was able to recognized in a resolved state without any pattern film loss by means of a scanning electron microscope, was observed.

<Developability>

A resist film of a composition was formed, and then a pattern was formed. Occurrence of scum and the level of undeveloped residue were examined using a scanning electron microscope.

<Depth of Focus (Focal Latitude):

Patterns were formed by an exposure corresponding to the effective sensitivity. The latitude of focus (focus range) over which resolution of 0.35 μm line-and-space pattern was able to be recognized without any pattern film loss by means of a scanning electron microscope, was observed.

<Pattern Shape>

Figure 1A:
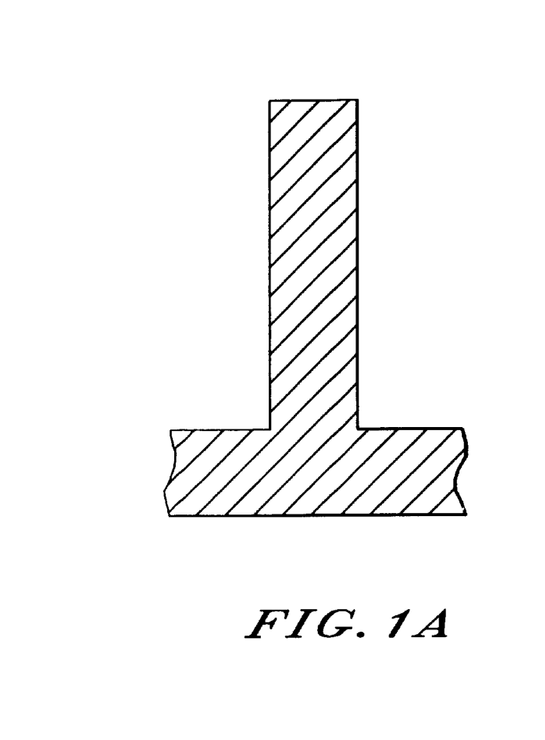
Figure 1B:
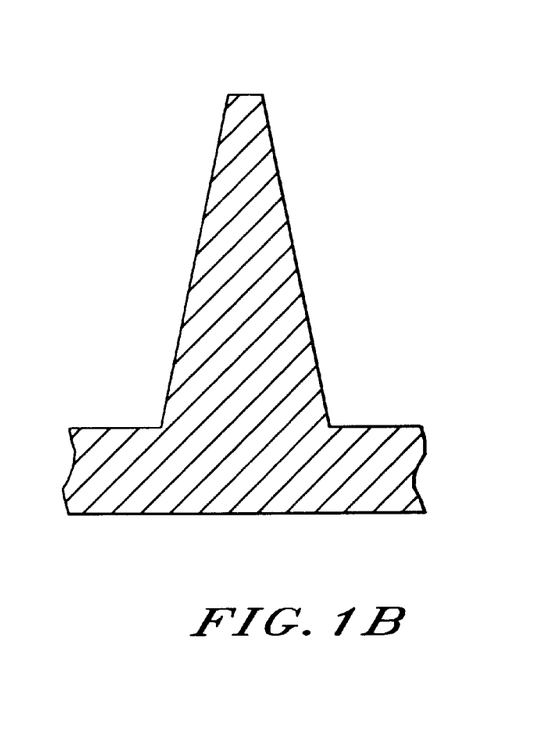
Figure 1C:
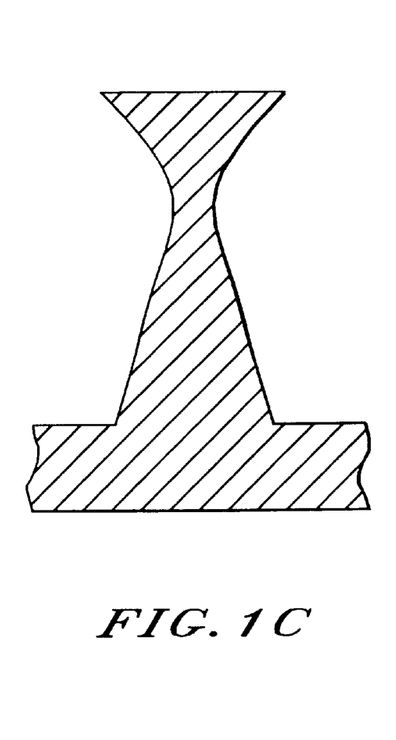

The cross section of 0.4 μm line-and-space pattern formed by an exposure corresponding to the effective sensitivity was observed using a scanning electron microscope. It was judged that to which shape, A, B or C shown in FIG. 1, the observed cross section corresponded.

<Synthesis of Resin (A)>

Synthesis Example 1

In an autoclave, m-cresol 69.2 g (0.64 mol), 2,3-xylenol 9.8 g (0.08 mol), 3,4-xylenol 9.8 g (0.08 mol), an aqueous 37% by weight formaldehyde solution 55.1 g (formaldehyde: 0.85 mol), oxalic acid dehydrate 5.0 g (0.04 mol), water 52.6 g, and dioxane 182 g were charged, and the autoclave was immersed in an oil bath, and condensation was carried out for 8 hours with stirring with the bulk temperature being kept at 130° C. After the reaction was completed, the reaction system was cooled to room temperature, and its content was taken out into a beaker. After the content being separated into two layers in this beaker, the lower layer was taken out, concentrated, and then dehydrated, followed by drying to recover a novolak resin. This resin was designated as resin (A1). The resin (A1) had an Mw of 8,600.

Synthesis Example 2

In an autoclave, m-cresol 64.9 g (0.6 mol), 2,3-xylenol 36.7 g (0.3 mol), 3,4-xylenol 12.2 g (0.1 mol), an aqueous 37% by weight formaldehyde solution 64.9 g (formaldehyde: 0.8 mol), oxalic acid dihydrate 6.3 g (0.05 mol), water 79.4 g, and dioxane 383.9 g were charged, and then the same operations as in Synthesis Example 1 were conducted to synthesize a novolak resin. This resin was designated as resin (A2). The resin (A2) had an Mw of 8,300.

<Synthesis of Quinonediazide Compound (B)>

In the following, the compound represented by said formula (5-3) is abbreviated to "precursor compound (5-3)", the compound represented by said formula (5-5) to "precursor compound (5-5)", and the compound represented by said formula (5-7) to "precursor compound (5-7)".

Synthesis Example 3

In a radiation-screened environment, in an flask having a stirrer, a dropping funnel and a thermometer, the precursor compound (5-3) 25.0 g (0.05 mol),

1,2-naphthoquinonediazido-5-sulfonic acid chloride 26.8 g (0.1 mol), and dioxane 311 g were charged and dissolved with stirring. Subsequently, this flask was immersed in a water bath controlled to 30° C., and at the time when the internal temperature became constant at 30° C., triethylamine 11.0 g (0.11 mol) was added to the solution using the dropping funnel so that the internal temperature did not exceed 35° C., followed by reaction at the same temperature for 2 hours. Thereafter, the precipitated triethylamine hydrochloride was removed by filtration, and the filtrate was poured into a large quantity of an aqueous diluted hydrochloric acid solution to precipitate the reaction product. Then, the precipitate was filtered, recovered, and dried at 40° C. over a whole day and night to obtain a quinonediazide compound (B1).

The composition of the quinonediazide compound (B1) was analyzed by HPLC, and as a result, the compound was composed of 22% of a triester, 68% of a diester, and 10% of a monoester, having the respective structures as shown below.

Triester

Diester

Monoester wherein D stands for a group represented by the formula:

Synthesis Example 4

Quinonediazide compound (B2) was obtained in the same manner as in Synthesis Example 3, except that the precursor compound (5-5) 29.5 g (0.05 mol),
1,2-naphthoquinonediazido-5-sulfonyl chloride 26.8 g (0.1 mol),
dioxane 336 g; and
triethylamine 11.1 g (0.11 mol)

were used.

The composition of the quinonediazide compound (B2) was analyzed by HPLC, and as a result, the compound was composed of 18% of a triester, 70% of a diester, and 12% of a monoester, having the respective structures as shown below.

Triester

Diester

-continued

Monoester wherein D stands for a group represented by the following formula:

Synthesis Example 5

Quinonediazide compound (B3) was obtained in the same manner as in Synthesis Example 3, except that
the precursor compound (5-7) 32.3 g (0.05 mol),
1,2-naphthoquinonediazido-5-sulfonyl chloride 26.8 g (0.1 mol),
dioxane 354 g, and
triethylamine 11.1 g (0.11 mol)
were used.

The composition of the quinonediazide compound (B3) was analyzed by HPLC, and as a result, the compound was composed of 98% of a diester, and 2% of a monoester, having the respective structures as shown below.

Diester

Monoester wherein D stands for a group represented by the following formula:

<Synthesis of other Quinonediazide Compounds>

Synthesis Example 6

Quinonediazide compound (C-1) was obtained in the same manner as in Synthesis Example 3, except that 14.6 g (0.05 mol) of a compound represented by the following formula:

1,2-naphthoquinonediazido-5-sulfonyl chloride 33.5 g (0.125 mol), dioxane 288 g, and triethylamine 13.9 g (0.138 mol)

were used.

The composition of the quinonediazide compound (C-1) was analyzed by HPLC, and as a result, the compound was composed of 73% of a triester, 21% of a diester, and 5% of a monoester.

Synthesis Example 7

Quinonediazide compound (C-2) was obtained in the same manner as in Synthesis Example 3, except that 21.2 g (0.05 mol) of a compound represented by the following formula:

1,2-naphthoquinonediazido-5-sulfonyl chloride 33.5 g (0.125 mol), dioxane 328 g, and triethylamine 13.9 g (0.138 mol)

were used.

The composition of the quinonediazide compound (C-2) was analyzed by HPLC, and as a result, the compound was composed of 68% of a triester, 27% of a diester, and 5% of a monoester.

Synthesis Example 8

Quinonediazide compound (C-3) was obtained in the same manner as in Synthesis Example 3, except that 37.8 g (0.1 mol) of a compound represented by the following formula:

1,2-naphthoquinonediazido-5-sulfonyl chloride 40.2 g (0.15 mol), dioxane 300 g,

N,N-dimethylformamide 75 g, and triethylamine 17.2 g (0.17 mol)

were used.

The composition of the quinonediazide compound (C-3) was analyzed by HPLC, and as a result, the compound was composed of 62% of a diester, 36% of a monoester, and 2% of the phenol compound used as a reactant.

Synthesis Example 9

Quinonediazide compound (C-4) was obtained in the same manner as in Synthesis Example 3, except that 18.2 g (0.05 mol) of a compound represented by the following formula:

1,2-naphthoquinonediazido-5-sulfonyl chloride 40.2 g (0.15 mol), dioxane 377 g, and triethylamine 17.2 g (0.17 mol)

were used.

The composition of the quinonediazide compound (C-4) was analyzed by HPLC, and as a result, the compound was composed of 23% of a tetraester, 69% of a triester, and 8% of a diester.

Examples 1–8 and Comparative Examples 1–3

In each example, a resin (A), a dissolution accelerator, a quinonediazide compound and a solvent were mixed in amounts given in Tables 1 and 2 wherein "part(s)" means "part(s) by weight" to form a uniform solution, followed by filtration using a membrane filter with a pore size of 0.2 $\mu$m to produce the solution of a composition.

The solution obtained was coated on a silicon wafer having a silicon oxide film, by means of a spin coater, followed by prebaking on a hot plate at 90° C. for 2 minutes to form a resist film with a thickness of 1.1 $\mu$m. Next, through a reticle, the resist film was exposed to radiation of 365 nm in wavelength (i-ray) by means of a reduction projection aligner (numerical lens aperture: 0.57), NSR-2005i9C (tradename), manufactured by Nikon Co., Ltd., post-baked at 110° C. on the hot plate for 1 minute, and then developed with an aqueous 2.38% by weight tetramethylammonium hydroxide solution, followed by rinsing with ultra-pure water and then drying to form a resist pattern. The resist pattern obtained was examined to evaluate performance. The results are given in Tables 3 and 4.

TABLE 1

| | Examples | | | | | | | |
|---|---|---|---|---|---|---|---|---|
| | 1 | 2 | 3 | 4 | 5 | 6 | 7 | 8 |
| Resin A | | | | | | | | |
| Kind | A1 | A2 | A2 | A2 | A1 | A1 | A2 | A1 |
| Part | 80 | 80 | 80 | 80 | 80 | 80 | 80 | 80 |
| Dissolution accelerator | | | | | | | | |
| Kind | α | α | α | β | α | α | β | α |
| Part | 20 | 20 | 20 | 20 | 20 | 20 | 20 | 20 |
| Quinone diazide compd. (B) | | | | | | | | |
| Kind | B1 | B2 | B1/B3 | B3 | B2 | B1 | B3 | B3 |
| Part | 30 | 30 | 10/20 | 25 | 25 | 15 | 20 | 20 |
| Other quinone diazide compd. | | | | | | | | |
| Kind | — | — | — | C-2 | C-1 | C-3/C-4 | C-4 | C-2/C-4 |
| Part | — | — | — | 5 | 5 | 10/10 | 12 | 5/5 |
| Solvent | | | | | | | | |
| Kind | S1/S2 | S1/S2 | S1 | S1/S2 | S1/S2 | S1/S2 | S1/S2 | S1/S2 |
| Part | 240/100 | 240/100 | 380 | 240/100 | 240/100 | 240/100 | 240/100 | 240/100 |

TABLE 2

| | Comparative Examples | | |
|---|---|---|---|
| | 1 | 2 | 3 |
| Resin A | | | |
| Kind | A1 | A2 | A2 |
| Part | 80 | 80 | 80 |
| Dissolution accelerator | | | |
| Kind | α | α | β |
| Part | 20 | 20 | 20 |
| Quinonediazide compd. (B) | | | |
| Kind | — | — | — |
| Part | — | — | — |
| Other quinonediazide compd. | | | |
| Kind | C-1 | C-2 | C-1/C-2 |
| Part | 30 | 27 | 25/5 |
| Solvent | | | |
| Kind | S1/S2 | S1/S2 | S1/S2 |
| Part | 240/100 | 240/100 | 240/100 |

Remarks for Tables 1 and 2

The types of the dissolution accelerators and solvents used were as follows:

Dissolution Accelerator

α: 1,1-bis(4-hydroxy-2,5-dimethylphenyl)acetone

β: 1,1-bis(4-hydroxyphenyl)-1-phenylethane

Solvent

S1: ethyl 2-hydroxypropionate

S2: ethyl 3-ethoxypropionate

TABLE 3

| Performance | Examples | | | | | | | |
|---|---|---|---|---|---|---|---|---|
| of resists | 1 | 2 | 3 | 4 | 5 | 6 | 7 | 8 |
| Effective sensitivity (msec) | 410 | 420 | 440 | 450 | 410 | 430 | 450 | 470 |
| Resolution (μm) | 0.30 | 0.30 | 0.30 | 0.30 | 0.32 | 0.32 | 0.30 | 0.32 |
| Depth of focus (μm) | 1.0 | 1.2 | 1.2 | 1.0 | 1.0 | 1.0 | 1.2 | 1.0 |
| Pattern shape | A | A | A | B | A | A | B | A |
| Developability | Good | Good | Good | Good | Good | Good | Good | Good |

TABLE 4

| Performance of | Comparative Examples | | |
|---|---|---|---|
| resists | 1 | 2 | 3 |
| Effective sensitivity (msec) | 490 | 510 | 500 |
| Resolution (μm) | 0.32 | 0.32 | 0.32 |
| Depth of focus (μm) | 0.6 | 0.6 | 0.6. |
| Pattern shape | C | B | B |
| Developability | Scum occurred | Scum occurred | Scum occurred | what is claimed is:

1. A radiation-sensitive resin composition comprising:

(A) an alkali soluble resin, and (B) a 1,2-quinonediazide compound represented by the following formula (1):

(1)

wherein $R^1$ to $R^6$ are independently an alkyl group, a cycloalkyl group or an aryl group; a and b are independently an integer of 1 to 3; $D^1$ and $D^2$ are independently a hydrogen atom or a 1,2-quinonediazidosulfonyl group, provided that at least one of $D^1$ is a 1,2-quinonediazidosulfonyl group; A is a single bond, —O—, —S—, —CH$_2$—, —C(CH$_3$)$_2$—, a group represented by the following formula (2):

or a group represented by the following formula (3):

and x and y are an integer of 0 to 2.

2. The composition according to claim 1, wherein the alkali soluble resin has a weight-average molecular weight in terms of polystyrene of 300 to 20,000.

3. The composition according to claim 1, which further comprises a phenol compound having a molecular weight of less than 2,000.

4. The composition according to claim 3, wherein the phenol compound is a compound selected from the group consisting of the phenol compounds represented by the following formulas (9-1) to (9-9):

wherein in the formulas (9-1) to (9-3), e and f are independently an integer of 0 to 3, x and y are independently an integer of 0 to 3, provided that e and f are not 0 at the same time, and meet $e+x \leq 5$ and $f+y \leq 5$;

wherein in the formulas (9-4) and (9-5), e, f and g are independently an integer of 0 to 3, x, y and z are independently an integer of 0 to 3, provided that e, f and g are not 0 at the same time, and meet $e+x \leq 5$, $f+y \leq 4$ and $g+z \leq 5$;

wherein in the formulas (9-6) to (9-8), e, f and g are independently an integer of 0 to 3, x, y and z are independently an integer of 0 to 3, provided that e, f and g are not 0 at the same time, and meet $e+x \leq 5$, $f+y \leq 5$ and $g+z \leq 5$; and (9-9)

wherein in the formula (9-9), e, f, g and h are independently an integer of 0 to 3, w, x, y and z are independently an integer of 0 to 3, provided that e, f, g and h are not 0 at the same time, and meet e+w≦5, f+x≦5, g+y≦5 and h+z≦5.

5. The composition according to claim 4, wherein the phenol compound is selected from the group consisting of formulas (9-3), (9-5), (9-6) and (9-7).

6. The composition according to claim 1, wherein the alkali soluble resin is an alkali soluble phenol resin having a weight-average molecular weight in terms of polystyrene of 2,000 to 20,000.

7. The composition according to claim 6, wherein said alkali soluble phenol resin is produced by subjecting a phenol compound represented by the following formula (4):

(4)

wherein n is an integer of 1 to 3, and an aldehyde compound to polycondensation.

8. The composition according to claim 7, wherein said aldehyde compound is selected from the group consisting of monoaldehyde compounds and bisaldehyde compounds.

9. The composition according to claim 7, wherein said aldehyde compound is selected from the group consisting of formaldehydes such as formaldehyde, trioxane, and paraformaldehyde; hemiformals such as methylhemiformal, ethylhemiformal, propylhemiformal, butylhemiformal, and phenylhemiformal; benzaldehydes such as benzaldehyde, o-hydroxybenzaldehyde, m-hydroxybenzaldehyde, p-hydroxybenzaldehyde, o-chlorobenzaldehyde, m-chlorobenzaldehyde, p-chlorobenzaldehyde, o-nitrobenzaldehyde, m-nitrobenzaldehyde, p-nitrobenzaldehyde, o-methylbenzaldehyde, m-methylbenzaldehyde, p-methylbenzaldehyde, p-ethylbenzaldehyde, and p-n-butylbenzaldehyde; acetaldehyde; propylaldehyde; phenylacetaldehyde; α-phenylpropylaldehyde; β-phenylpropylaldehyde; furfural glyoxal, glutaraldehyde, terephthalaldehyde and isophthalaldehyde.

10. The composition according to claim 9, wherein said aldehyde compound is selected from the group consisting of formaldehyde, butylhemiformal and o-hydroxybenzaldehyde.

11. The composition according to claim 7, wherein said phenol compound having the formula (4) is a member selected from the group consisting of phenol, o-cresol, m-cresol, p-cresol, 2,3-xylenol, 2,5-xylenol, 3,4-xylenol, 3,5-xylenol, 2,3,5-trimethylphenol and 3,4,5-trimethylphenol, and particularly preferably phenol, m-cresol, p-cresol, 2,3-xylenol, 2,5-xylenol, 3,4-xylenol, 3,5-xylenol and 2,3,5-trimethylphenol.

12. The composition according to claim 11, wherein said phenol compound of the formula (4) is a combination of m-cresol/p-cresol in a weight ratio of 30-95/5-70, m-cresol/2,3-xylenol/3,4-xylenol in a weight ratio of 20-95/5-80/0-75, or m-cresol/2,3,5-trimethylphenol/2,3-xylenol in a weight ratio of 20-95/5-80/0-75.

13. The composition according to claim 7, wherein said aldehyde compound is used in an amount of 0.7 to 3.0 mols per mol of the phenol compound for the polycondensation.

14. A radiation-sensitive resin composition comprising:
(A) an alkali soluble resin, and
(B) a 1,2-quinonediazide compound represented by the following formula (1):

(1)

wherein $R^1$ up $R^6$ are independently an alkyl group, a cycloalkyl group or an aryl group; a and b are independently an integer of 1 to 3; $D^1$ and $D^2$ are independently a hydrogen atom or a 1,2-quinonediazidosulfonyl group, provided that at least one of $D^1$ is a 1,2-quinonediazidosulfonyl group; A is a single bond, —O—, —S—, —CH$_2$—, —C(CH$_3$)$_2$—, a group represented by the following formula (2):

(2)

or a group represented by the following formula (3);

(3)

and x and y are an integer of 0 to 2, and said 1,2-quinonodiezide compound is selected from the group consisting of the 1,2-benzoquinonediazido-4-sulfonic acid esters, 1,2-naphthoquinonediazido-4-sulfonic acid esters, 1,2-naphthoquinonediazido-5-sulfonic acid esters, and 1,2-naphthoquinonediazido-6-sulfonic acid esters of the precursor compounds represented by the formulas (5-1) to (5-8):

(5-1)

(5-2)

(5-3)

(5-4)

(5-5)

(5-6)

(5-7)

(5-8)

15. The composition according to claim 14, wherein said 1,2-quinonediazide compound of the component (B) is selected from the group consisting of the 1,2-naphthoquinonediazido-4-sulfonic acid esters, and 1,2-naphthoquinonediazido-5-sulfonic acid esters.